(12) United States Patent
Hidri et al.

(10) Patent No.: US 9,780,886 B2
(45) Date of Patent: Oct. 3, 2017

(54) CIRCUIT ARRANGEMENT AND METHOD FOR RECEIVING OPTICAL SIGNALS

(71) Applicant: SILICON LINE GMBH, Munich (DE)

(72) Inventors: Ols Hidri, Munich (DE); Martin Groepl, Sonthofen Oberallgaeu (DE); Holger Hoeltke, Munich (DE)

(73) Assignee: Silicon Line GmbH, Munich (DE)

( * ) Notice: Subject to any disclaimer, the term of this patent is extended or adjusted under 35 U.S.C. 154(b) by 0 days.

(21) Appl. No.: 14/926,862

(22) Filed: Oct. 29, 2015

(65) Prior Publication Data
US 2016/0050026 A1 Feb. 18, 2016

Related U.S. Application Data

(63) Continuation of application No. PCT/EP2014/058937, filed on Apr. 30, 2014.

(30) Foreign Application Priority Data

Apr. 30, 2013 (EP) .................................... 13166092

(51) Int. Cl.
| | | |
|---|---|---|
| H04B 10/69 | (2013.01) | |
| H03F 17/00 | (2006.01) | |
| H03F 3/08 | (2006.01) | |

(52) U.S. Cl.
CPC ........... H04B 10/6931 (2013.01); H03F 3/08 (2013.01); H03F 17/00 (2013.01); H04B 10/693 (2013.01);
(Continued)

(58) Field of Classification Search
CPC ........ H04B 10/60–10/6973; H03F 3/08; H03F 17/00
See application file for complete search history.

(56) References Cited

U.S. PATENT DOCUMENTS 4,763,326 A 8/1988 Krick
4,972,408 A 11/1990 Herve et al.
(Continued)

FOREIGN PATENT DOCUMENTS

EP 0203757 A2 12/1986
JP 2009-049488 A 3/2009

OTHER PUBLICATIONS

International Search Report issued in Application No. PCT/EP2014/058937, Aug. 4, 2014.

*Primary Examiner* — David Payne
*Assistant Examiner* — Casey Kretzer
(74) *Attorney, Agent, or Firm* — Studebaker & Brackett PC

(57) ABSTRACT

In order to further develop a circuit arrangement (CR; CR') for receiving optical signals (SI) from at least one optical guide (GU), said circuit arrangement (CR; CR') comprising:
- at least one light-receiving component (PD) for converting the optical signals (SI) into electrical current signals ($I_{PD}$),
- at least one transimpedance amplifier (TA), being provided with the electrical current signals ($I_{PD}$) from the light-receiving component (PD),
- at least one automatic gain controller (AG) for controlling the gain or transimpedance (R) of the transimpedance amplifier (TA),
- at least one integrator (IN) in a feedback path (FP), said integrator (IN) generating a control signal ($V_{int}$),
- at least one voltage-controlled current source (CS), being provided with the control signal ($V_{int}$) from the integrator (IN),
- at least one limiter (LI) acting as a comparator and generating in its output a logic level for positive or negative voltages in its input, (Continued)

and a corresponding method in such a way that a multilevel optical link can be provided, at least one second transimpedance amplifier (TA2) arranged in parallel to the transimpedance amplifier (TA), and at least one automatic offset controller (AO) for setting the voltage ($V_{offset}$) for the second transimpedance amplifier (TA2)

are proposed.

20 Claims, 4 Drawing Sheets

(52) U.S. Cl.
CPC ... *H04B 10/6933* (2013.01); *H04B 2210/074* (2013.01)

(56) References Cited

U.S. PATENT DOCUMENTS

| | | | |
|---|---|---|---|
| 6,763,060 B1* | 7/2004 | Knapp | H04B 1/1615 327/147 |
| 2003/0198452 A1* | 10/2003 | Chown | G02B 6/4284 385/134 |
| 2005/0040892 A1* | 2/2005 | Seetharaman | H03F 1/08 330/308 |
| 2005/0047801 A1* | 3/2005 | Schrodinger | H04B 10/6933 398/202 |
| 2006/0216042 A1* | 9/2006 | Yeo | H03G 3/3084 398/209 |
| 2008/0309407 A1 | 12/2008 | Nakamura et al. | |
| 2011/0069956 A1* | 3/2011 | Biegert | H04B 10/66 398/58 |
| 2011/0135315 A1 | 6/2011 | Liu et al. | |
| 2011/0135320 A1* | 6/2011 | Amberg | H04B 10/69 398/208 |

* cited by examiner

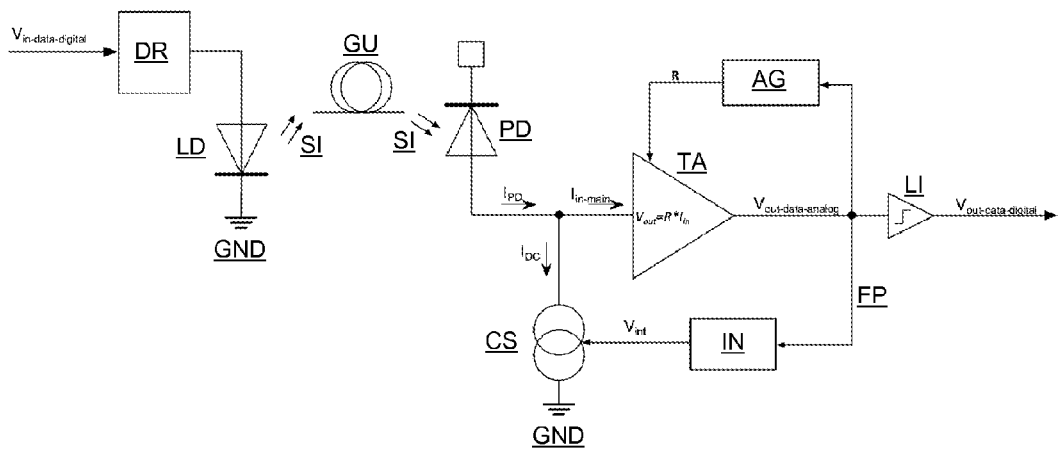
Fig. 1 (= prior art)
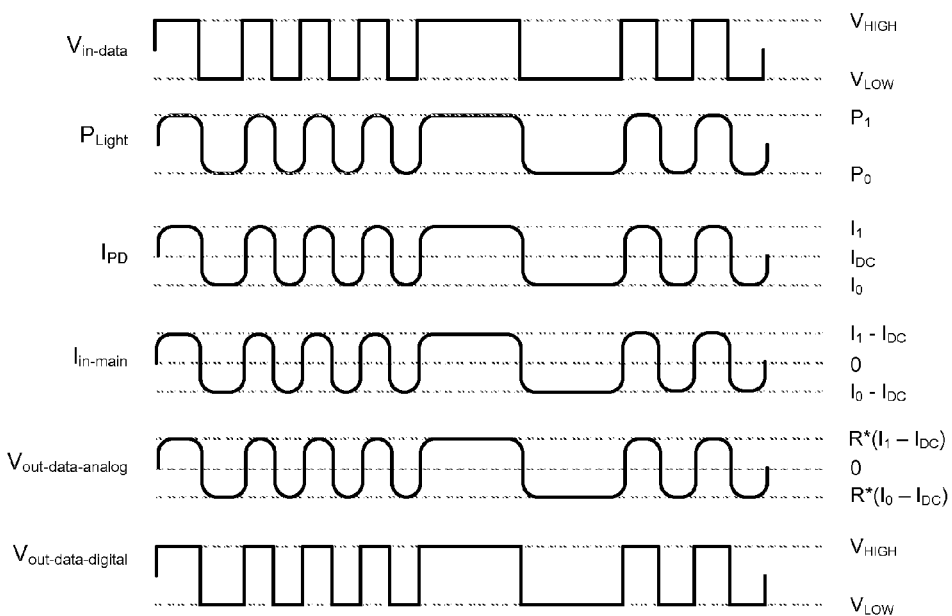
Fig. 2 (= prior art)

CIRCUIT ARRANGEMENT AND METHOD FOR RECEIVING OPTICAL SIGNALS

CROSS-REFERENCE TO RELATED APPLICATIONS

This application is a continuation of international (WO) patent application no. PCT/EP2014/058937, filed 30 Apr. 2014, which claims the priority of European (EP) patent application no. 13 166 092.0, filed 30 Apr. 2013, the contents of each being hereby incorporated herein by reference.

FIELD OF THE INVENTION

The present invention basically relates to the technical field of optical transmission of signals.

More particularly, the present invention relates to a circuit arrangement for receiving optical signals as well as to a corresponding method.

Within the scope of the present invention, the term optical or light is understood not only as the range of electromagnetic radiation visible to the eye, extending in a wavelength range from about 380 nanometers to about 780 nanometers (which corresponds to a frequency of about 789 terahertz down to about 385 terahertz).

Rather, the term light or light-emitting is understood as the entire electromagnetic wavelength or frequency spectrum, including the spectrum not visible to the eye, in particular the I[nfra]R[ed] range (wavelength range up to about 2,000 nanometers or frequency range down to about 150 terahertz), for example a wavelength of about 850 nanometers or a frequency of about 350 terahertz.

BACKGROUND OF THE INVENTION

A typical optical communication system (cf. FIG. 1: typical optical link; FIG. 2: typical optical link signalling) comprises three components:
- a light-emitting element LD, for example a laser diode, together with its driver DR, which converts the electrical data logic levels to optical power logic levels;
- a light guide GU, for example a fibre, which carries the light; and
- a light-receiving element PD, for example a photodetector, such as a photodiode, together with a transimpedance amplifier TA, which senses the light at the end of the light guide GU and converts the light back to an electrical signal.

Such a system typically transmits two-level electrical data pattern $V_{in\text{-}data\text{-}digital}$ and recovers a replica two-level electrical data pattern $V_{out\text{-}data\text{-}digital}$ at the receiver side. Light (optical) power levels $P_1$ and $P_0$ (cf. FIG. 2) injected into the light guide GU correspond to each electrical level $V_{HIGH}$ and $V_{LOW}$. It follows that, at the receiver side, two different light power levels arrive at the input of the light-receiving element PD. These two different light power levels generate two different current levels, namely $I_1$ and $I_0$.

The current signal $I_{PD}$ generated at the light-receiving element PD has to be converted to a voltage signal. The current generated by the light-receiving element PD is converted to voltage by the transimpedance amplifier TA, wherein $V_{out\text{-}data\text{-}analog} = R \ast I_{in\text{-}main}$, with R being the gain or transimpedance of the transimpedance amplifier TA.

An integrator IN in the feedback path FP generates a control signal $V_{int}$ in order to subtract the average input current coming from the light-receiving element PD. This is done in order to generate the zero crossing in the input of a limiter LI. The limiter LI acts as a comparator which generates in its output a $V_{HIGH}$ ($V_{LOW}$) logic level for positive (negative) voltages in its input. The automatic gain control block AG controls the transimpedance amplifier gain R in order to keep the amplitude $V_{out\text{-}data\text{-}analog}$ to a desired level (for example constant) for different $I_{PD}$ current levels that might occur as input to the transimpedance amplifier TA.

In case another low speed signal is to be transmitted from the transmitter side to the receiver side, a status change in the transmitter side could be transmitted to the receiver side. This could be for example a change from EIOS (Electrical Idle Ordered Set—a type of data link layer packet) state to EIEOS (Electric Idle Exit Ordered Set) state in the PCI Express standard.

Another optical link could be dedicated to the new signal. However, this is very costly because extra components and extra power is required. Also in some cases, dedicating a complete extra optical link might not be an option at all.

If the slow speed signal is transmitted over the same optical link, which means that the high-speed signals and the low-speed signals share the same optical components (physical medium), a third optical power level $P_2$ different from $P_1$ and from $P_0$ is to be transmitted in order to be able to distinguish between the two signals, making a multi-level signalling necessary.

OBJECTS AND SUMMARY OF THE INVENTION

Starting from the above-explained disadvantages and technical problems as well as taking the outlined prior art into account, the object of the present invention is to further develop a circuit arrangement of the above-mentioned type and a method of the above-mentioned type in such way that a multilevel optical link can be provided.

This object is achieved by a circuit arrangement according to the present invention with the herein described features and by a method according to the present invention with the herein described features. Advantageous embodiments and expedient further developments of the present invention are characterized in the respective sub-claims.

This object is achieved by a circuit arrangement for receiving optical signals from at least one optical guide, said circuit arrangement comprising:
- at least one light-receiving component for converting the optical signals into electrical current signals,
- at least one transimpedance amplifier, being provided with the electrical current signals from the light-receiving component,
- at least one automatic gain controller for controlling the gain or transimpedance of the transimpedance amplifier, in particular in order to keep the amplitude of the output of the transimpedance amplifier to a desired, for example constant, level for different levels of the electrical current signals,
- at least one integrator in a feedback path, said integrator generating a control signal,
- at least one voltage-controlled current source, being provided with the control signal from the integrator,
- at least one limiter acting as a comparator and generating in its output a logic level for positive or negative voltages in its input,
- at least one second transimpedance amplifier arranged in parallel to the transimpedance amplifier, and
- at least one automatic offset controller for setting the voltage for the second transimpedance amplifier.

This object is achieved by a method for receiving optical signals from at least one optical guide, said method comprising the steps of:
- converting the optical signals into electrical current signals by means of at least one light-receiving component;
- provided the electrical current signals from the light-receiving component to at least one transimpedance amplifier;
- controlling the gain or transimpedance of the transimpedance amplifier by means of at least one automatic gain controller, in particular in order to keep the amplitude of the output of the transimpedance amplifier to a desired, for example constant, level for different levels of the electrical current signals;
- generating a control signal by means of at least one integrator in a feedback path;
- providing the control signal from the integrator to at least one voltage-controlled current source;
- generating in the output of at least one limiter a logic level for positive or negative voltages in its input; and
- setting the voltage for at least one second transimpedance amplifier by means of at least one automatic offset controller, said second transimpedance amplifier being arranged in parallel to the transimpedance amplifier.

This object is further achieved by an embodiment according to the present invention wherein at least one second limiter is assigned to the second transimpedance amplifier and to the automatic offset controller.

This object is further achieved by an embodiment according to the present invention wherein the second transimpedance amplifier
- corresponds to the transimpedance amplifier, or
- is a scaled version of the transimpedance amplifier.

This object is further achieved by an embodiment according to the present invention wherein the automatic gain controller sets the same gain or same transimpedance for both the transimpedance amplifier and the second transimpedance amplifier by sensing the amplitude of the output of the transimpedance amplifier.

This object is further achieved by an embodiment according to the present invention wherein at least one peak detector circuit is provided for sensing the amplitude of the output of the transimpedance amplifier.

This object is further achieved by an embodiment according to the present invention wherein the peak detector circuit is part of the automatic gain control or is shared between the automatic gain controller and the automatic offset controller.

This object is further achieved by an embodiment according to the present invention wherein the amplitude of the output of the transimpedance amplifier is provided to the input of the automatic offset controller.

This object is further achieved by an embodiment according to the present invention wherein the transimpedance amplifier is at least one multi-stage amplifier.

This object is further achieved by an embodiment according to the present invention wherein the second transimpedance amplifier is at least one multi-stage amplifier.

This object is further achieved by an embodiment according to the present invention wherein a short is arranged between the output node of the first stage of the transimpedance amplifier and the output node of the first stage of the second transimpedance amplifier.

This object is further achieved by an embodiment according to the present invention wherein the light-receiving component is at least one photodetector, in particular at least one photodiode.

This object is further achieved by an embodiment according to the present invention wherein the optical guide is at least one fibre.

This object is further achieved by an embodiment according to the present invention wherein the end of the optical guide, which is not assigned to the light-receiving component, is assigned to at least one light-emitting component, which is preceded by at least one driver for converting electrical data logic levels into the optical signals.

The above-disclosed circuit arrangement may work according to the above-disclosed method.

The present invention finally relates to the use of at least one circuit arrangement according to the type presented hereinbefore and/or of the method according to the type presented hereinbefore for the optical transmission of data signals and of status signals.

BRIEF DESCRIPTION OF THE DRAWINGS

As has already been discussed hereinbefore, there are various possibilities for embodying and further developing the teaching of the present invention in an advantageous manner. For this purpose, on the one hand reference is made to the explanations above and to the dependent claims, and on the other hand further embodiments, features and advantages of the present invention are explained in greater detail hereinafter, inter alia by way of the exemplary embodiments illustrated by FIG. 3 to FIG. 5.

It is shown in:

FIG. 1 in a schematic diagram an example of a circuit arrangement according to the prior art operating according to the method of the prior art;

FIG. 2 in a comparative diagram an example of the prior art signalling of the circuit arrangement of FIG. 1;

Like or similar embodiments, elements or features are provided with identical reference numerals in FIG. 1 to FIG. 5.

DETAILED DESCRIPTION OF THE INVENTION

Figure 3:
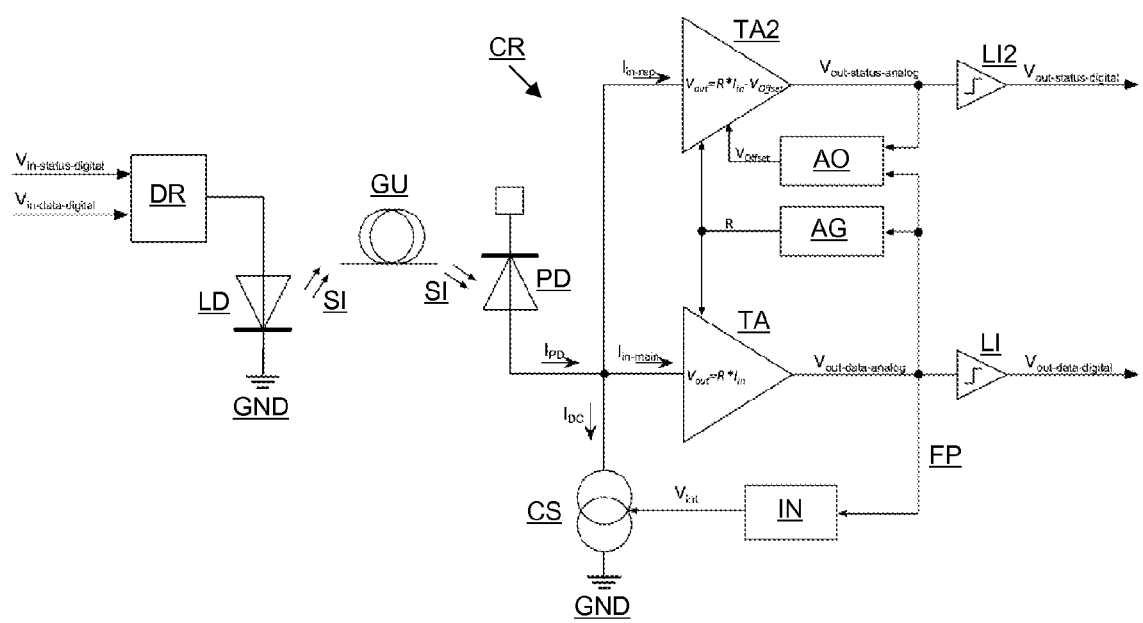
FIG. 3 in a schematic diagram a first exemplary embodiment of a circuit arrangement according to the present invention operating according to the method of the present invention.
Figure 4:
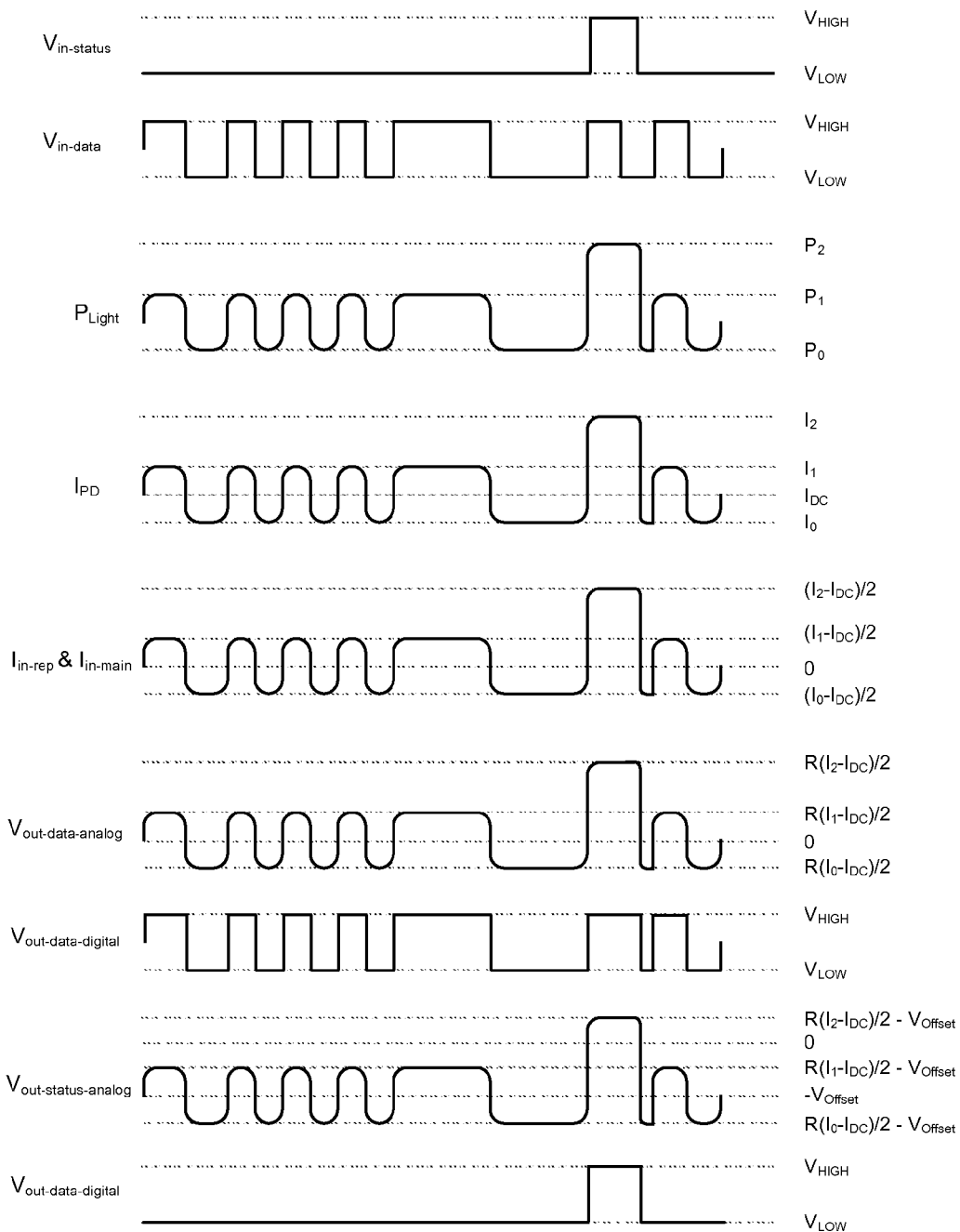
FIG. 4 in a comparative diagram an exemplary embodiment of the signalling of the circuit arrangement of FIG. 3.
Figure 5:
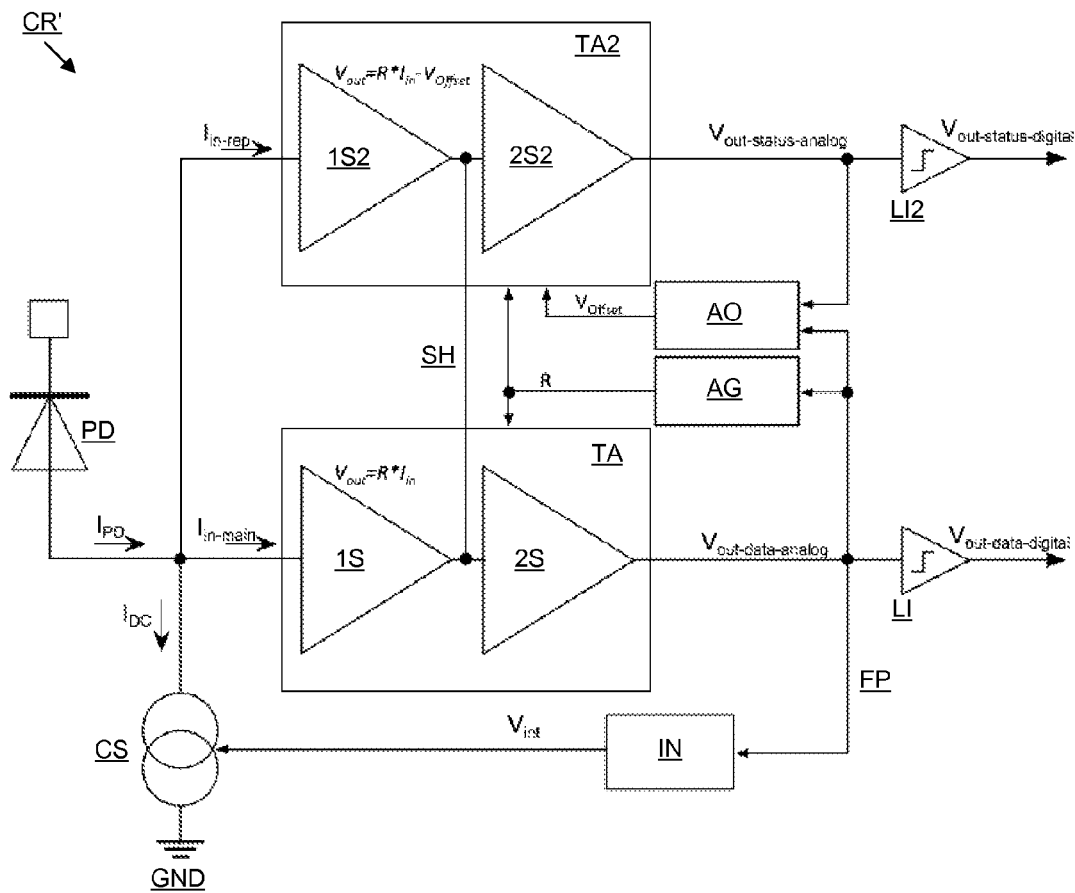
FIG. 5 in a schematic diagram a second exemplary embodiment of a circuit arrangement according to the present invention operating according to the method of the present invention.

In order to avoid unnecessary repetitions, the following explanations regarding the embodiments, features and advantages of the present invention—unless specified otherwise—relate both
- to the first exemplary embodiment of a circuit arrangement CR shown in FIG. 3, FIG. 4 and
- to the second exemplary embodiment of a circuit arrangement CR' shown in FIG. 5.

A typical optical communication system (cf. FIG. 1: typical optical link; FIG. 2: typical optical link signalling) has been explained above in the chapter "Background of the present invention". In order to avoid unnecessary repetitions, these explanations in the chapter "Background of the present invention" are incorporated by reference in the present chapter "Best mode of embodying the present invention" with regard to the present invention; in particular, the explanations in the chapter "Background of the present invention" with regard to FIG. 1 are incorporated by reference in the present chapter "Best mode of embodying the present invention" with regard to FIG. 3 and/or to FIG. 5, and the explanations in the chapter "Background of the present invention" with regard to FIG. 2 are incorporated by reference in the present chapter "Best mode of embodying the present invention" with regard to FIG. 4.

According to the present invention and compared to the typical optical link as shown in FIG. 1, a signal $V_{in\text{-}status\text{-}digital}$ is inputted on the transmitter side. $V_{in\text{-}status\text{-}digital}$ is a slow signal comprising short pulses widely spaced-in-time. The transition rate of $V_{in\text{-}status\text{-}digital}$ is significantly low compared to the transition rate of $V_{in\text{-}data\text{-}digital}$.

$V_{in\text{-}status\text{-}digital}$, together with the high speed signal $V_{in\text{-}data\text{-}digital}$, modulates the transmitted optical signal as shown in the signal listing in FIG. 4 (=optical link signalling according to a preferred embodiment of the present invention). The optical power $P_2$ is chosen to be higher than $P_1$, such that the received currents $I_2$ and $I_1$ fulfill the relation $I_2 \geq 2*I_1$.

The second transimpedance amplifier TA2 can be a copy of the transimpedance amplifier TA, or the second transimpedance amplifier TA2 can be an exactly scaled version of the transimpedance amplifier TA. The automatic gain control block AG sets the same gain or same transimpedance R for both the transimpedance amplifier TA and the second transimpedance amplifier TA2 by sensing only the $V_{out\text{-}data\text{-}analog}$ amplitude with of a peak detector circuit, which can be part of the automatic gain control AG or can be shared between the automatic gain control AG and an automatic offset control AO.

The automatic offset control AO sets the voltage $V_{offset}$ for the second transimpedance amplifier TA2; for example, $V_{offset}$ can be $R*(I_1-I_0)/2$. The value of $V_{offset}$ is independent of $I_2$, and the information about its value is extracted only from $V_{out\text{-}data\text{-}analog}$. For example, $V_{offset}=R*(I_1-I_0)/2$ is achieved by setting $V_{offset}$ double the amplitude.

Again the amplitude $V_{out\text{-}data\text{-}analog}$ can be measured with a peak detector circuit. The peak detector circuit can be part of the automatic offset control AO or can be shared between the automatic offset control AO and the automatic gain control AG. To close the feed-back loop for the $V_{offset}$ control, $V_{out\text{-}status\text{-}analog}$ is used as the feedback signal for the automatic offset control block AO because the $V_{out\text{-}status\text{-}analog}$ average value is $-V_{offset}$. The averaging circuit is part of the automatic offset control block AO.

As to the link operation, during an initial phase, only the high speed $V_{in\text{-}data\text{-}digital}$ signal is transmitted. The $V_{in\text{-}status\text{-}digital}$ signal is kept low during this phase. Also, during this initial phase, the automatic gain control AG and the automatic offset control AO outputs settle to their final value. The time constant of these two loops is significantly lower than the time distance between the two consecutive pulses on the $V_{in\text{-}status\text{-}digital}$ signal.

Only after this first initial phase the $V_{in\text{-}status\text{-}digital}$ signal can be transmitted. When the $V_{in\text{-}status\text{-}digital}$ signal is low, the $V_{out\text{-}data\text{-}digital}$ signal follows the $V_{in\text{-}data\text{-}digital}$ signal. When the $V_{in\text{-}status\text{-}digital}$ signal is high, the optical power transmitted is always $P_2$, independently of the value of the $V_{in\text{-}data\text{-}digital}$ signal. As a consequence, $V_{out\text{-}data\text{-}digital}$ will be high independently of the value of $V_{in\text{-}data\text{-}digital}$. The $V_{out\text{-}status\text{-}digital}$, as desired, goes high as well.

As to an improvement of the signal-to-noise ratio on the receiver side, in case and the second transimpedance amplifier TA2 are multistage amplifiers, in order to improve the signal-to-noise ratio, a short between the output nodes of the first stage of the first transimpedance amplifier TA and of the first stage of the second transimpedance amplifier TA2 can be provided, as depicted in FIG. 5.

Such shorting does not have any effect on the desired signal. Only the total noise power drops compared to a non-shorted version. Hence an improvement of the signal-to-noise ratio can be achieved in the receiver.

By means of the above-proposed arrangement as well as method, the slow speed signal can be reliably transmitted by sharing the same physical optical link and using multilevel signalling.

LIST OF REFERENCE NUMERALS

AG automatic gain controller or automatic transimpedance controller
AO automatic offset controller
CR circuit arrangement (=first embodiment; cf. FIG. 3)
CR' circuit arrangement (=second embodiment; cf. FIG. 5)
CS current source, in particular voltage-controlled current source
DR driver
FP feedback path
GND reference potential, in particular earth potential or ground potential or zero potential
GU optical guide, in particular fibre
IN integrator
$I_{DC}$ input of current source CS
$I_{in\text{-}main}$ input of transimpedance amplifier TA
$I_{in\text{-}rep}$ input of second transimpedance amplifier TA2
$I_{PD}$ electrical current signal
LD light-emitting component, in particular laser diode
LI limiter, in particular first limiter
LI2 second limiter
PD light-receiving component, in particular photodetector, for example photodiode
R gain of transimpedance amplifier TA or transimpedance of transimpedance amplifier TA
SH short
SI optical signal
TA transimpedance amplifier, in particular first transimpedance amplifier
TA2 second transimpedance amplifier
$V_{in\text{-}data\text{-}digital}$ input, in particular data input, of driver DR
$V_{in\text{-}status\text{-}digital}$ input, in particular status input, of driver DR
$V_{int}$ control signal or output of integrator IN
$V_{offset}$ voltage for second transimpedance amplifier TA2
$V_{out\text{-}data\text{-}analog}$ output of transimpedance amplifier TA
$V_{out\text{-}data\text{-}digital}$ output of limiter LI
$V_{out\text{-}status\text{-}analog}$ output of second transimpedance amplifier TA2
$V_{out\text{-}status\text{-}digital}$ output of second limiter LI2
1S first stage of transimpedance amplifier TA
1S2 first stage of second transimpedance amplifier TA2
2S further or second stage of transimpedance amplifier TA
2S2 further or second stage of second transimpedance amplifier TA2

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention.

What is claimed is:

1. A circuit arrangement for receiving optical signals from at least one optical guide, said circuit arrangement comprising:
   at least one light-receiving component for converting the optical signals into electrical current signals,
   at least one transimpedance amplifier, being provided with the electrical current signals from the at least one light-receiving component,
   at least one automatic gain controller for controlling a gain or transimpedance of the at least one transimpedance amplifier,
   at least one integrator in a feedback path, said at least one integrator generating a control signal,
   at least one voltage-controlled current source, being provided with the control signal from the at least one integrator,
   at least one limiter acting as a comparator and generating in its output a logic level for positive or negative voltages in its input,
   at least one second transimpedance amplifier arranged in parallel to the at least one transimpedance amplifier, and
   at least one automatic offset controller for setting a voltage for the at least one second transimpedance amplifier,
   wherein a short is arranged between an output node of a first stage of the at least one transimpedance amplifier and an output node of a first stage of the at least one second transimpedance amplifier.

2. The circuit arrangement according to claim 1, further comprising at least one second limiter coupled to only the at least one second transimpedance amplifier and to the at least one automatic offset controller.

3. The circuit arrangement according to claim 1, wherein the at least one second transimpedance amplifier
   is a copy of the at least one transimpedance amplifier, or
   is a scaled version of the at least one transimpedance amplifier.

4. The circuit arrangement according to claim 1, wherein the at least one automatic gain controller sets the same gain or same transimpedance for both the at least one transimpedance amplifier and the at least one second transimpedance amplifier by sensing an amplitude of an output of the at least one transimpedance amplifier.

5. The circuit arrangement according to claim 4, wherein the amplitude of the output of the at least one transimpedance amplifier is provided to an input of the at least one automatic offset controller.

6. The circuit arrangement according to claim 4, further comprising at least one peak detector circuit for sensing the amplitude of the output of the at least one transimpedance amplifier.

7. The circuit arrangement according to claim 6, wherein the amplitude of the output of the at least one transimpedance amplifier is provided to an input of the at least one automatic offset controller.

8. The circuit arrangement according to claim 6, wherein the at least one peak detector circuit is part of the automatic gain control or is shared between the at least one automatic gain controller and the at least one automatic offset controller.

9. The circuit arrangement according to claim 8, wherein the amplitude of the output of the at least one transimpedance amplifier is provided to an input of the at least one automatic offset controller.

10. The circuit arrangement according to claim 1, wherein the at least one transimpedance amplifier is at least one multi-stage amplifier.

11. The circuit arrangement according to claim 1, wherein the at least one second transimpedance amplifier is at least one multi-stage amplifier.

12. The circuit arrangement according to claim 1, wherein the at least one light-receiving component is at least one photodetector.

13. The circuit arrangement according to claim 1, wherein the at least one optical guide is at least one fibre.

14. The circuit arrangement according to claim 1, wherein an end of the at least one optical guide, which is not coupled to only the at least one light-receiving component, is coupled to only at least one light-emitting component, which is preceded by at least one driver, wherein the at least one driver and the at least one light-receiving component are for converting electrical data logic levels into the optical signals.

15. Use of at least one circuit arrangement according to claim 1 for optical transmission of data signals and of status signals comprising:
   optically transmitting the data signals, and
   optically transmitting the status signals.

16. A circuit arrangement for receiving optical signals from at least one optical guide, said circuit arrangement comprising:
   at least one light-receiving component for converting the optical signals into electrical current signals,
   at least one transimpedance amplifier, being provided with the electrical current signals from the at least one light-receiving component,
   at least one automatic gain controller for controlling a gain or transimpedance of the at least one transimpedance amplifier,
   at least one integrator in a feedback path, said at least one integrator generating a control signal,
   at least one voltage-controlled current source, being provided with the control signal from the at least one integrator,
   at least one limiter acting as a comparator and generating in its output a logic level for positive or negative voltages in its input,
   at least one second transimpedance amplifier arranged in parallel to the at least one transimpedance amplifier, and
   at least one automatic offset controller for setting a voltage for the at least one second transimpedance amplifier,
   wherein the at least one second transimpedance amplifier is at least one multi-stage amplifier, and
   wherein a short is arranged between an output node of a first stage of the at least one transimpedance amplifier and an output node of a first stage of the at least one second transimpedance amplifier.

17. A method for receiving optical signals from at least one optical guide, comprising the steps of:
   converting the optical signals into electrical current signals by means of at least one light-receiving component;
   providing the electrical current signals from the at least one light-receiving component to at least one transimpedance amplifier;

controlling a gain or transimpedance of the at least one transimpedance amplifier by means of at least one automatic gain controller;

generating a control signal by means of at least one integrator in a feedback path;

providing the control signal from the at least one integrator to at least one voltage-controlled current source;

generating in an output of at least one limiter a logic level for positive or negative voltages in its input; and setting a voltage for at least one second transimpedance amplifier by means of at least one automatic offset controller, said at least one second transimpedance amplifier being arranged in parallel to the at least one transimpedance amplifier, wherein a short is arranged between an output node of a first stage of the at least one transimpedance amplifier and an output node of a first stage of the at least one second transimpedance amplifier.

18. The method according to claim 17, wherein the gain or transimpedance of the at least one transimpedance amplifier is controlled in order to keep an amplitude of an output of the at least one transimpedance amplifier to a desired level for different levels of the electrical current signals.

19. The method according to claim 18, wherein the desired level is a constant level.

20. A method for receiving optical signals from at least one optical guide, comprising the steps of:

converting the optical signals into electrical current signals by means of at least one light-receiving component;

providing the electrical current signals from the at least one light-receiving component to at least one transimpedance amplifier;

controlling a gain or transimpedance of the at least one transimpedance amplifier by means of at least one automatic gain controller;

generating a control signal by means of at least one integrator in a feedback path;

providing the control signal from the at least one integrator to at least one voltage-controlled current source;

generating in an output of at least one limiter a logic level for positive or negative voltages in its input; and setting a voltage for at least one second transimpedance amplifier by means of at least one automatic offset controller, said at least one second transimpedance amplifier being arranged in parallel to the at least one transimpedance amplifier, wherein the at least one second transimpedance amplifier is at least one multi-stage amplifier, and wherein a short is arranged between an output node of a first stage of the at least one transimpedance amplifier and an output node of a first stage of the at least one second transimpedance amplifier.

\* \* \* \* \*